(12) United States Patent
Aoyagi et al.

(10) Patent No.: US 10,971,412 B2
(45) Date of Patent: Apr. 6, 2021

(54) MOUNTING SUBSTRATE AND ELECTRONIC APPARATUS

(71) Applicant: Sony Semiconductor Solutions Corporation, Kanagawa (JP)

(72) Inventors: Akiyoshi Aoyagi, Kanagawa (JP); Ken Kikuchi, Tokyo (JP); Katsuhiro Tomoda, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 15/128,227

(22) PCT Filed: Mar. 17, 2015

(86) PCT No.: PCT/JP2015/057848
§ 371 (c)(1),
(2) Date: Sep. 22, 2016

(87) PCT Pub. No.: WO2015/151797
PCT Pub. Date: Oct. 8, 2015

(65) Prior Publication Data
US 2017/0103926 A1    Apr. 13, 2017

(30) Foreign Application Priority Data
Mar. 31, 2014  (JP) .............................. JP2014-074843

(51) Int. Cl.
*H01L 21/66*  (2006.01)
*H01L 25/075*  (2006.01)
(Continued)

(52) U.S. Cl.
CPC ............ *H01L 22/22* (2013.01); *F21V 19/003* (2013.01); *G09G 3/32* (2013.01); *H01L 25/0753* (2013.01);
(Continued)

(58) Field of Classification Search
USPC .................................................... 362/249.01
See application file for complete search history.

(56) References Cited

U.S. PATENT DOCUMENTS 5,812,105 A    9/1998  Van de Ven
6,184,853 B1   2/2001  Hebiguchi et al.
(Continued)

FOREIGN PATENT DOCUMENTS

EP    0 989 539 A1    3/2000
EP    2 680 326 A2    1/2014
(Continued)

OTHER PUBLICATIONS

International Search Report and English translation thereof dated Jun. 2, 2015 in connection with International Application No. PCT/JP2015/057847.
(Continued)

*Primary Examiner* — Rafferty D Kelly
(74) *Attorney, Agent, or Firm* — Wolf, Greenfield & Sacks, P.C.

(57) ABSTRACT

A mounting substrate according to an embodiment of the present technology includes: a wiring substrate (30); a plurality of light-emitting elements (12) arranged in a matrix on the wiring substrate; and a plurality of drive ICs (13) that are arranged in a matrix on the wiring substrate, and control light emission of the light-emitting elements. The light-emitting elements and the drive ICs are mounted on a same surface. The wiring substrate includes a plurality of first wiring lines (16) on a mounting surface whre the light-emitting elements and the dive ICs are mounted. The first wiring lines electrically couple the light-emitting elements to the drive ICs.

3 Claims, 13 Drawing Sheets

(51) Int. Cl.
*H01L 25/16* (2006.01)
*H01L 33/62* (2010.01)
*F21V 19/00* (2006.01)
*G09G 3/32* (2016.01)
*H01L 33/54* (2010.01)
*H01L 33/58* (2010.01)
*F21Y 115/10* (2016.01)

(52) U.S. Cl.
CPC ............ *H01L 25/167* (2013.01); *H01L 33/54* (2013.01); *H01L 33/58* (2013.01); *H01L 33/62* (2013.01); *F21Y 2115/10* (2016.08); *G09G 2300/0408* (2013.01); *G09G 2300/0421* (2013.01); *H01L 2924/0002* (2013.01)

(56) References Cited

U.S. PATENT DOCUMENTS

| | | | |
|---|---|---|---|
| 6,501,441 | B1 | 12/2002 | Ludtke et al. |
| 7,250,978 | B2 | 7/2007 | Lee et al. |
| 10,510,286 | B2 | 12/2019 | Aoyagi et al. |
| 2004/0032220 | A1 | 2/2004 | Cok et al. |
| 2005/0017268 | A1 | 1/2005 | Tsukamoto et al. |
| 2005/0057641 | A1 | 3/2005 | Ogihara et al. |
| 2006/0061535 | A1 | 3/2006 | Kim et al. |
| 2006/0158393 | A1 | 7/2006 | Fukumoto et al. |
| 2006/0263003 | A1 | 11/2006 | Asai et al. |
| 2008/0129363 | A1 | 6/2008 | Usui |
| 2008/0174515 | A1 | 7/2008 | Matthies et al. |
| 2008/0211760 | A1 | 9/2008 | Baek et al. |
| 2008/0308797 | A1 | 12/2008 | Akimoto et al. |
| 2009/0033644 | A1 | 2/2009 | Kawaguchi et al. |
| 2009/0179891 | A1 | 7/2009 | Kim |
| 2010/0156771 | A1 | 6/2010 | Lee et al. |
| 2010/0177089 | A1 | 7/2010 | Huang |
| 2010/0207851 | A1* | 8/2010 | Cok .................... G09G 3/3208 345/82 |
| 2010/0253677 | A1 | 10/2010 | Kroll et al. |
| 2011/0057861 | A1 | 3/2011 | Cok et al. |
| 2011/0102309 | A1 | 5/2011 | Cho |
| 2012/0256814 | A1 | 10/2012 | Ootorii |
| 2013/0009938 | A1 | 1/2013 | Hwang et al. |
| 2013/0049033 | A1 | 2/2013 | Nei |
| 2013/0228905 | A1* | 9/2013 | von Koblinski ........ H01L 24/27 257/668 |
| 2014/0001502 | A1 | 1/2014 | Akimoto et al. |
| 2014/0117314 | A1 | 5/2014 | Jeong et al. |
| 2014/0159798 | A1 | 6/2014 | Duan |
| 2014/0168037 | A1 | 6/2014 | Sakariya et al. |
| 2015/0131017 | A1 | 5/2015 | Ro et al. |
| 2015/0161930 | A1 | 6/2015 | Kim et al. |
| 2015/0169011 | A1 | 6/2015 | Bibl et al. |
| 2015/0243220 | A1 | 8/2015 | Kim et al. |
| 2015/0277180 | A1 | 10/2015 | Seo et al. |
| 2016/0267836 | A1 | 9/2016 | Meersman et al. |
| 2018/0174973 | A1 | 6/2018 | Aoyagi |
| 2018/0218668 | A1 | 8/2018 | Aoyagi et al. |

FOREIGN PATENT DOCUMENTS

| | | |
|---|---|---|
| JP | 2001-215528 A | 8/2001 |
| JP | 2003-115613 A | 4/2003 |
| JP | 2005-033141 A | 2/2005 |
| JP | 2006-179942 A | 7/2006 |
| JP | 2006-251534 A | 9/2006 |
| JP | 2007-188079 A | 7/2007 |
| JP | 2009-037164 A | 2/2009 |
| JP | 2010-015163 A | 1/2010 |
| JP | 2010-238323 A | 10/2010 |
| JP | 2012-042567 A | 3/2012 |
| JP | 2012-142376 A | 7/2012 |
| JP | 2012-518208 A | 8/2012 |
| JP | 2012-227514 A | 11/2012 |
| JP | 2014-011275 A | 1/2014 |
| WO | WO 97/24706 A2 | 7/1997 |
| WO | WO 99/41788 A1 | 8/1999 |
| WO | WO 2010/096341 A1 | 8/2010 |
| WO | WO 2013/105347 A1 | 7/2013 |

OTHER PUBLICATIONS

International Search Report and English translation thereof dated Jun. 2, 2015 in connection with International Application No. PCT/JP2015/057848.
Written Opinion with English translation thereof dated Jun. 2, 2015 in connection with International Application No. PCT/JP2015/057847.
Written Opinion with English translation thereof dated Jun. 2, 2015 in connection with International Application No. PCT/JP2015/057848.
International Search Report and English translation thereof dated Jun. 16, 2015 in connection with International Application No. PCT/JP2015/057849.
Written Opinion with English translation thereof dated Jun. 16, 2015 in connection with International Application No. PCT/JP2015/057849.
International Preliminary Report on Patentability and English translation thereof dated Oct. 13, 2016 in connection with International Application No. PCT/JP2015/057847.
International Preliminary Report on Patentability and English translation thereof dated Oct. 13, 2016 in connection with International Application No. PCT/JP2015/057848.
International Preliminary Report on Patentability and English translation thereof dated Oct. 13, 2016 in connection with International Application No. PCT/JP2015/057849.
U.S. Appl. No. 15/128,438, filed Sep. 23, 2016, Aoyagi et al.
U.S. Appl. No. 15/128,443, filed Sep. 23, 2016, Aoyagi.

* cited by examiner

[ FIG. 1 ]
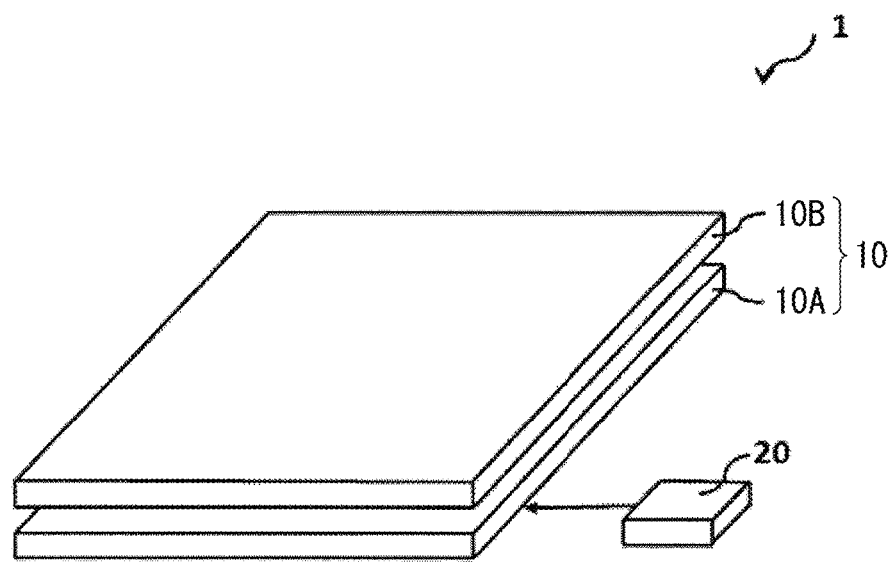

[ FIG. 2 ]
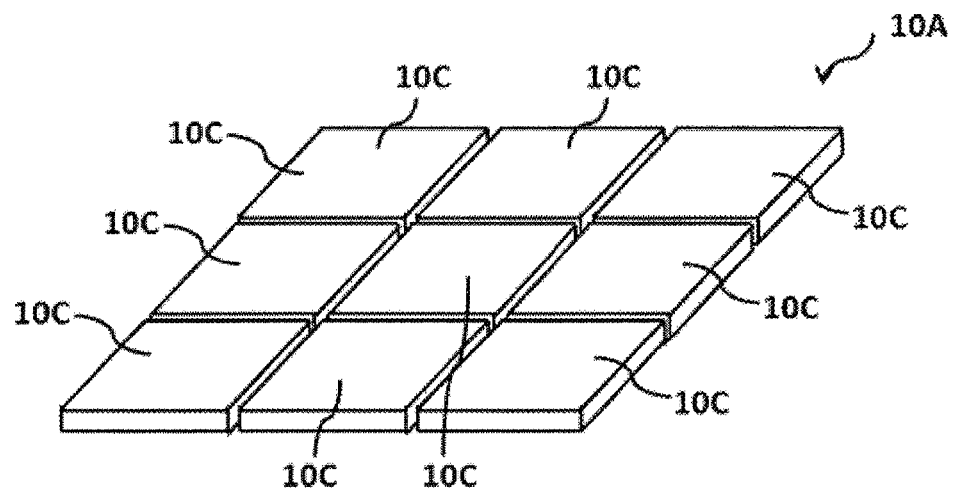
[ FIG. 3 ]
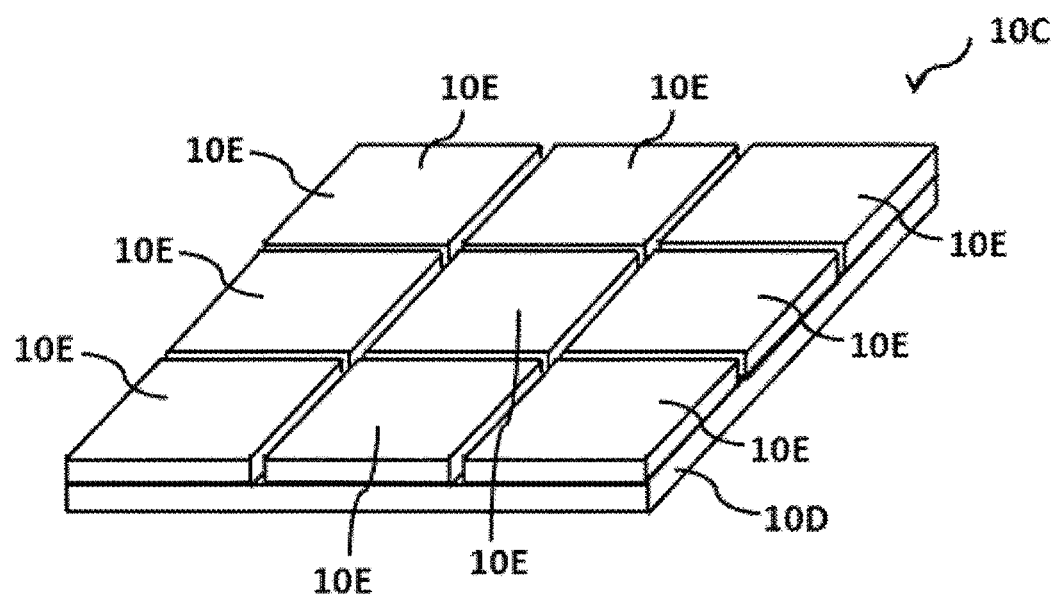

[FIG. 4]
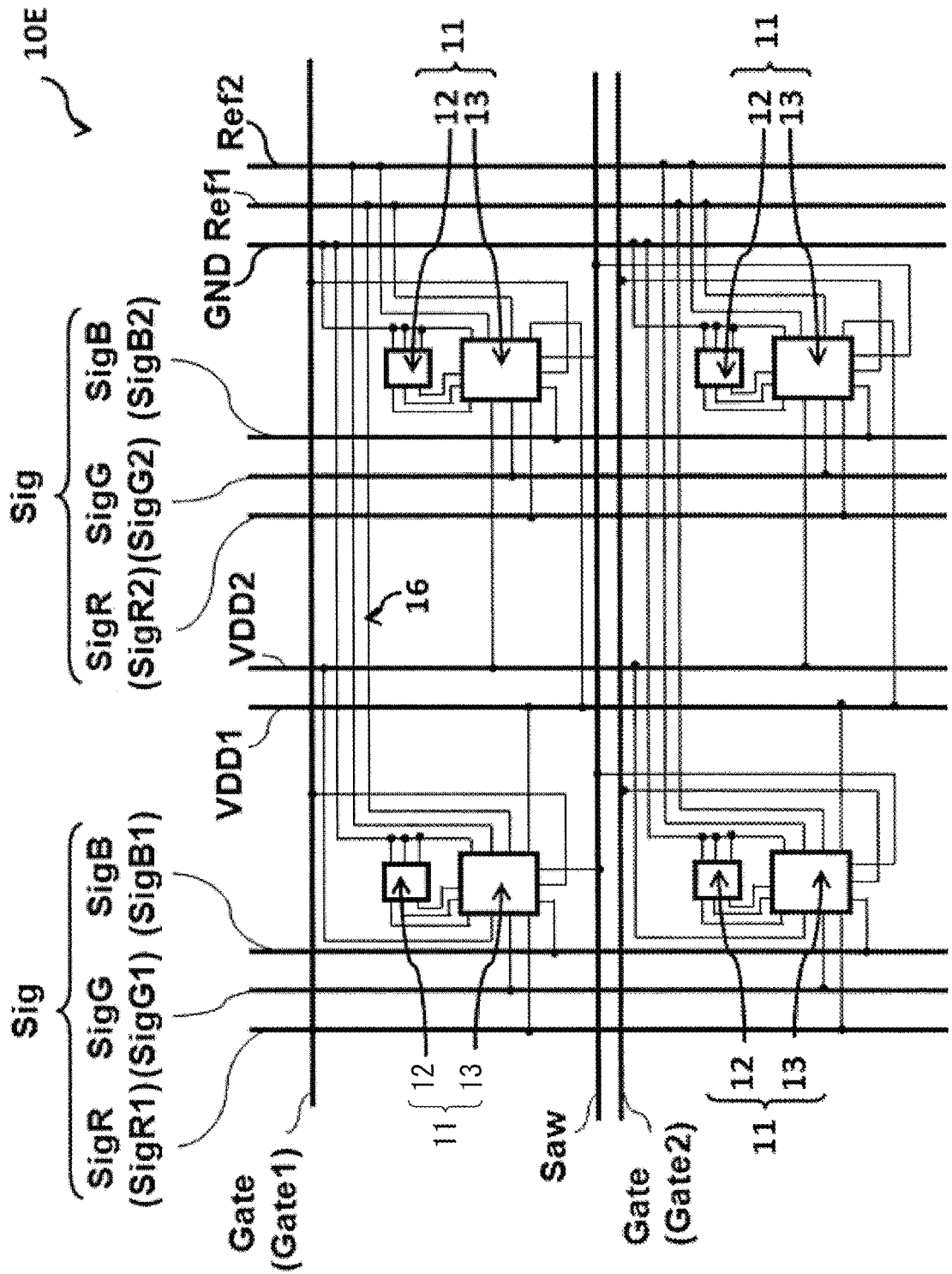

[ FIG. 5 ]
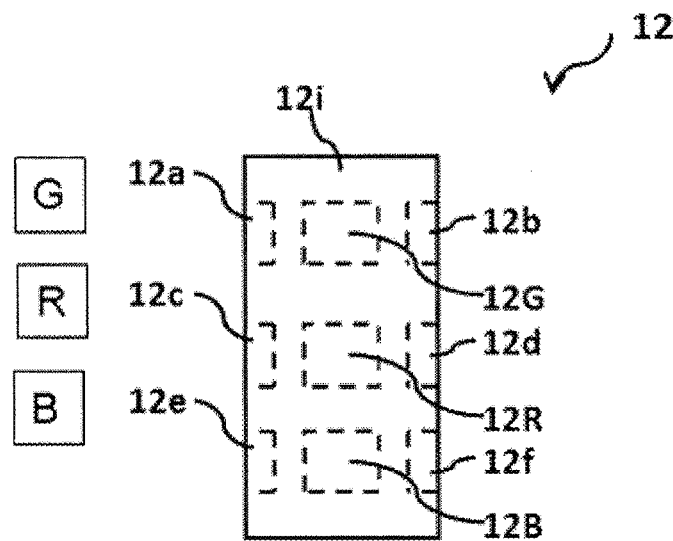
[ FIG. 6 ]
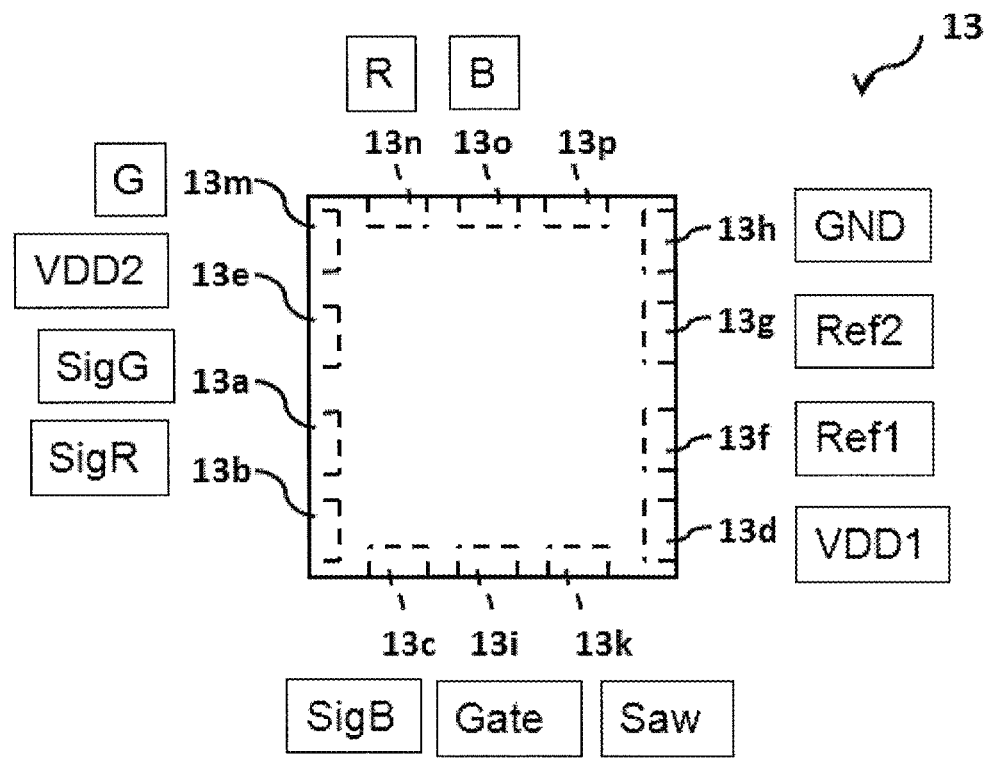

[FIG. 7]
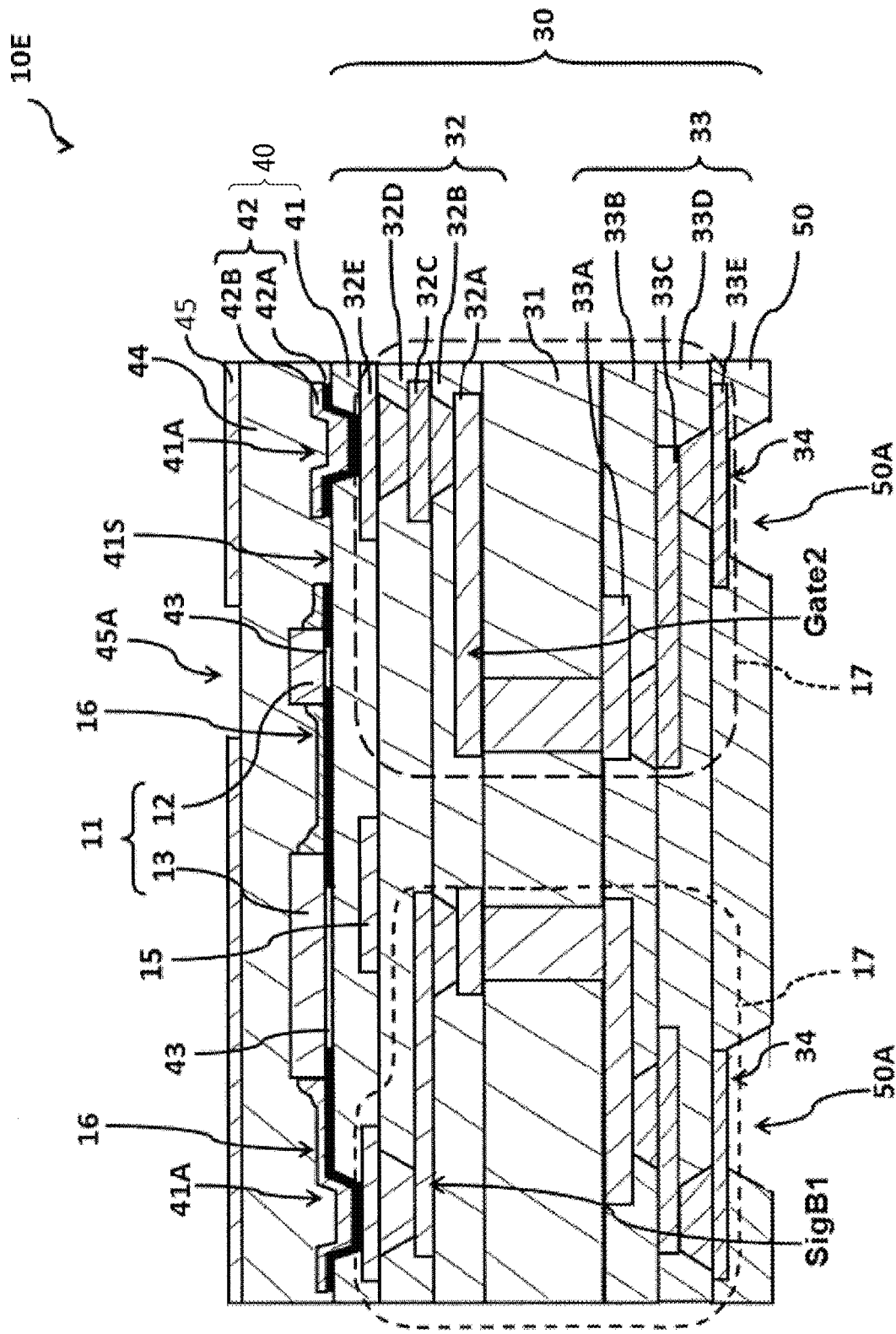

[FIG. 8]
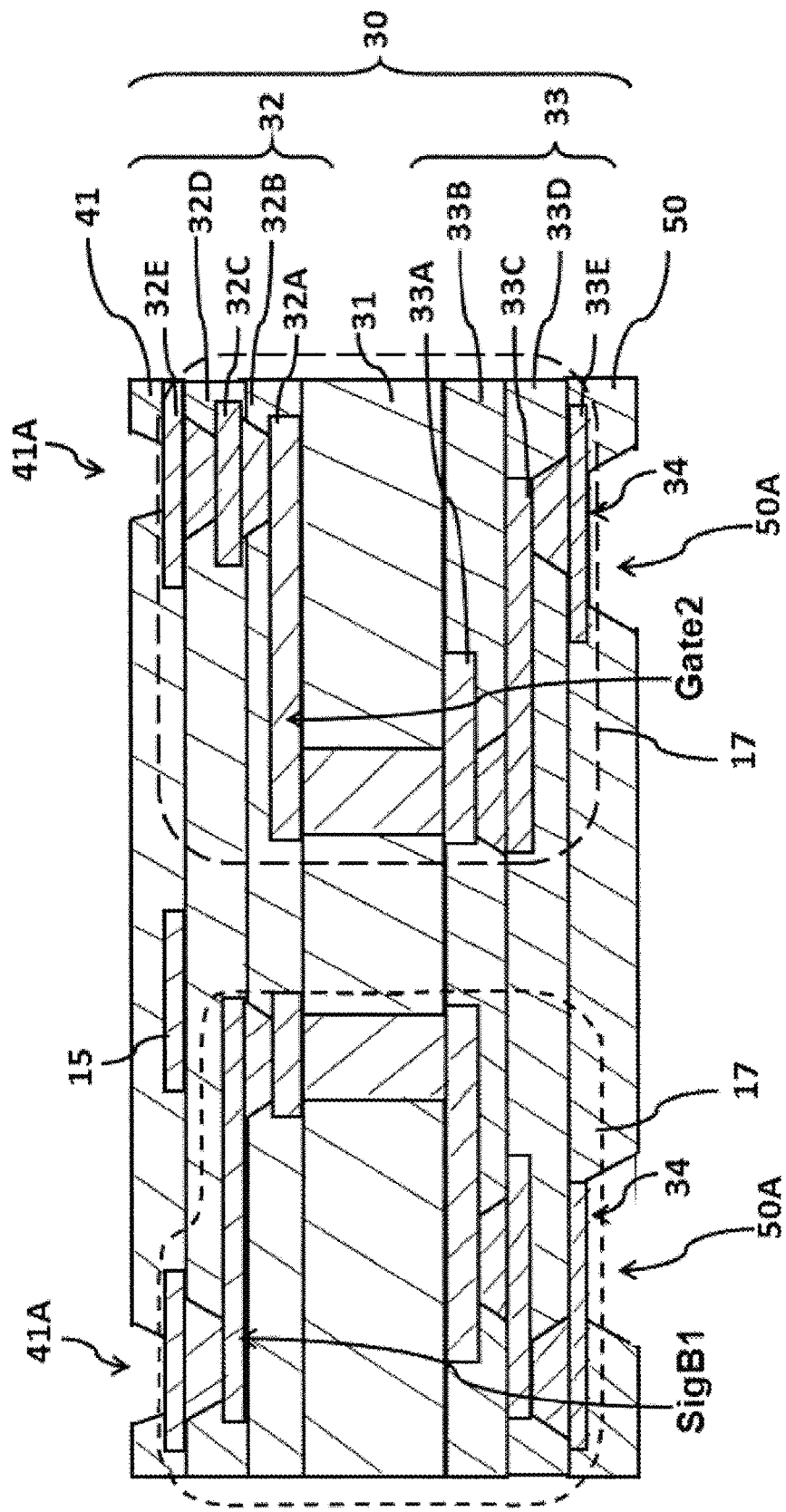

[FIG. 9]
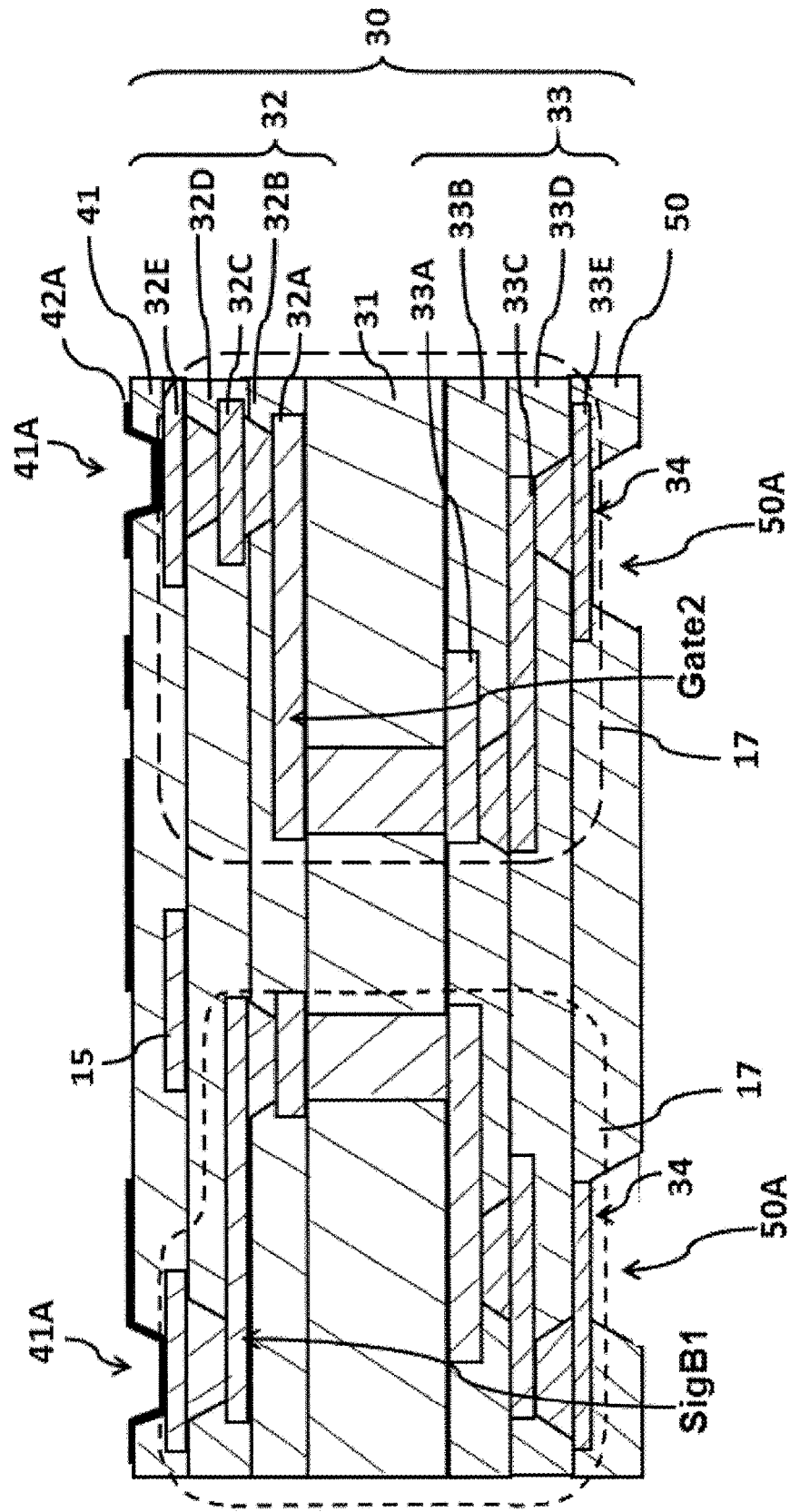

[ FIG. 10 ]
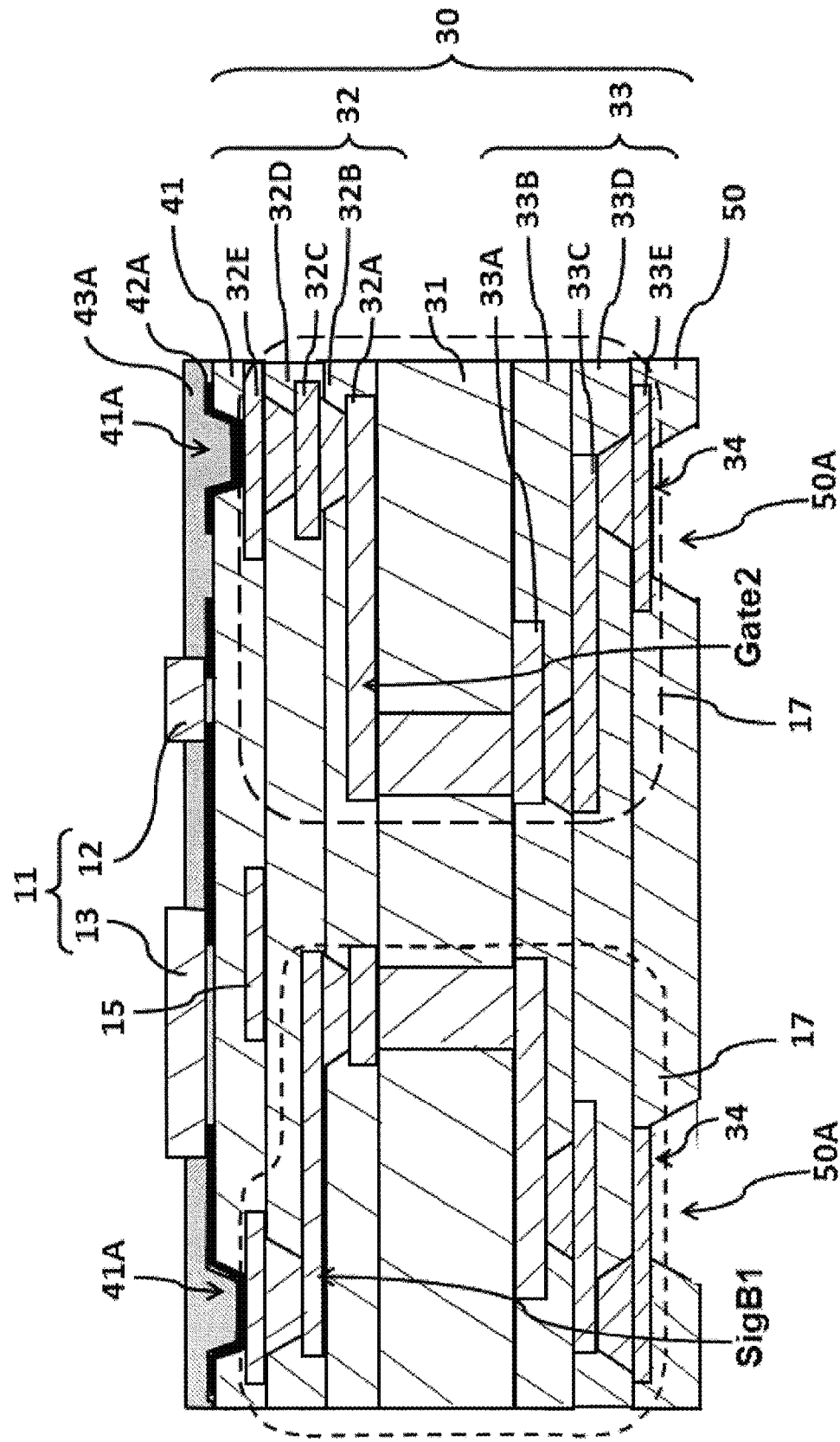

[ FIG. 11 ]
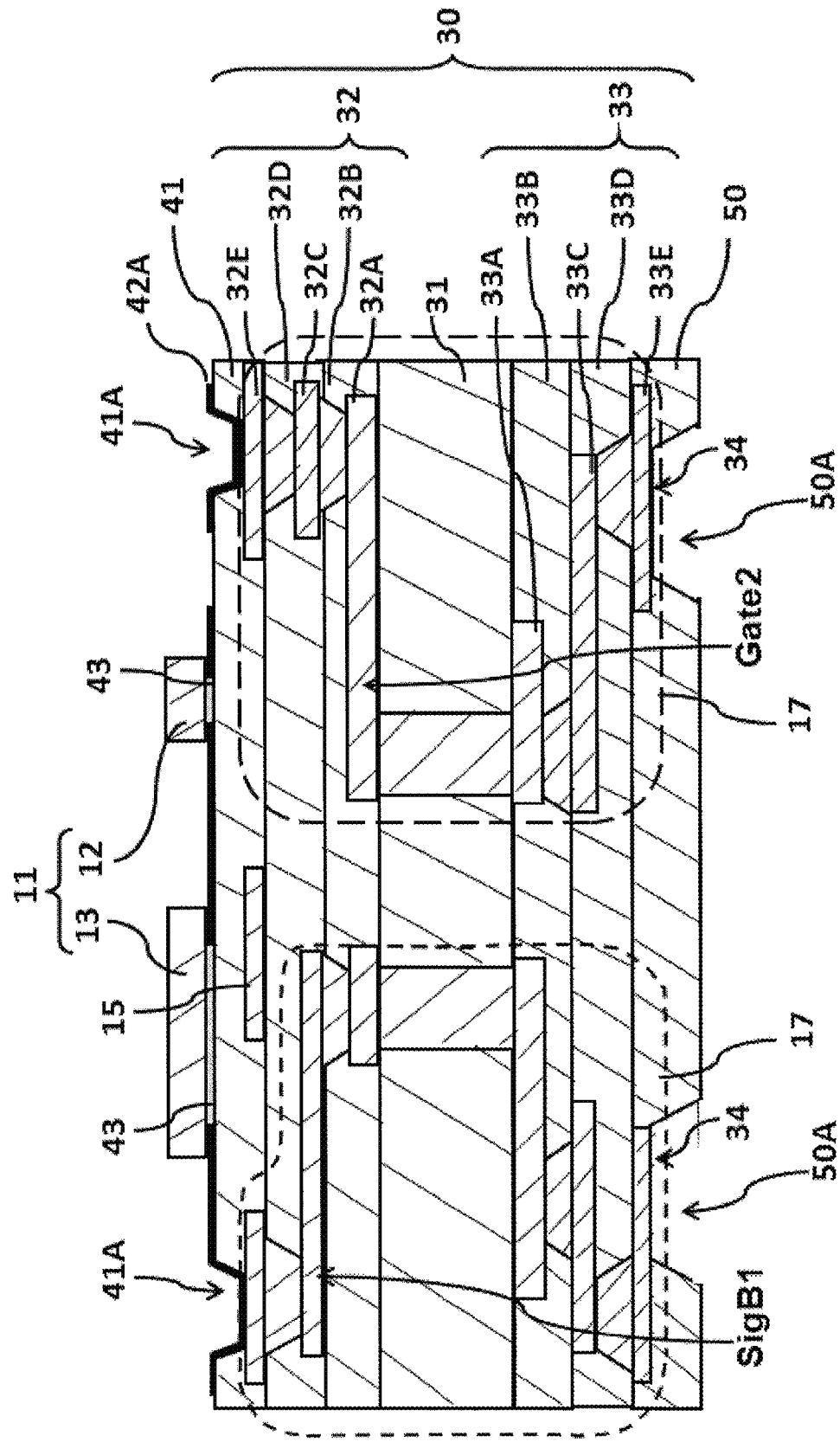

[ FIG. 12 ]
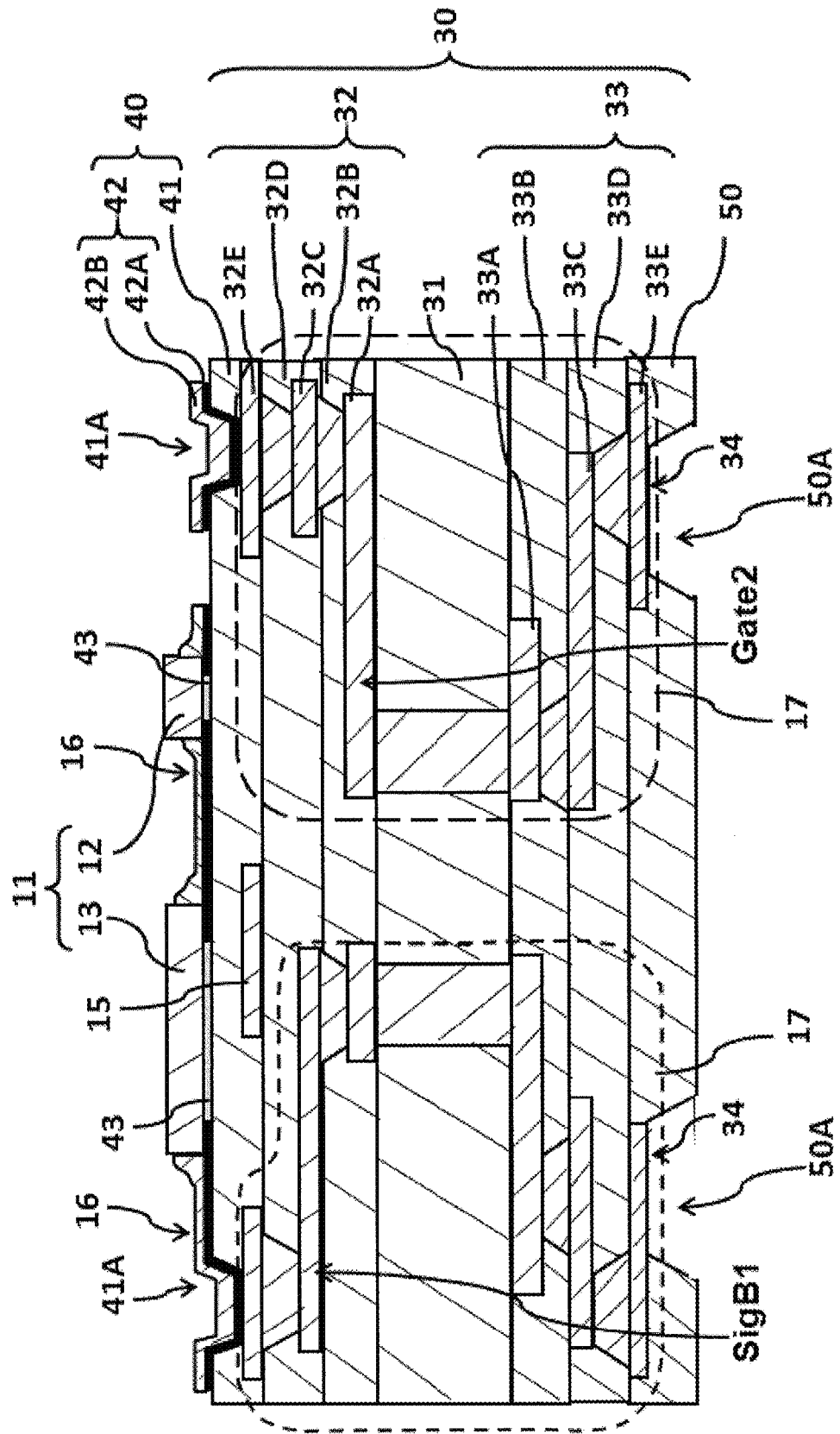

[ FIG. 13 ]
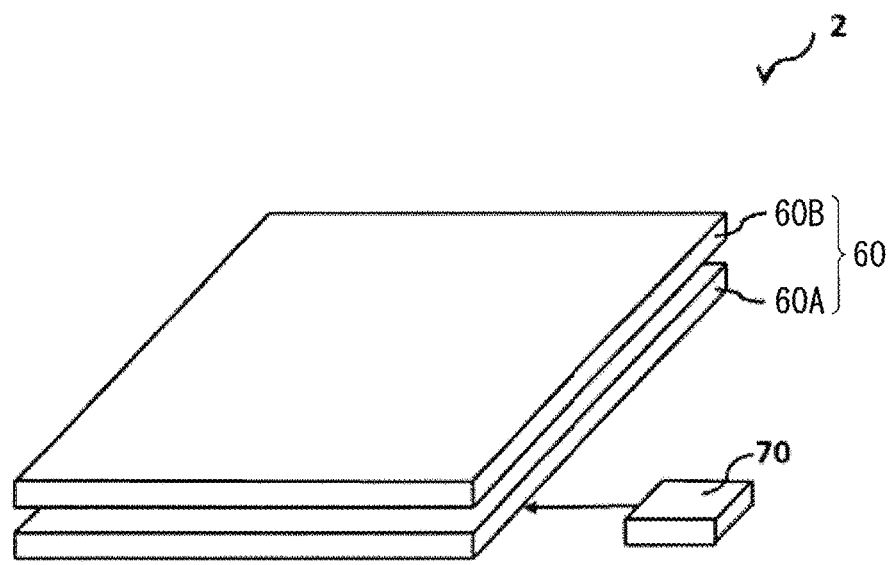

[ FIG. 14 ]
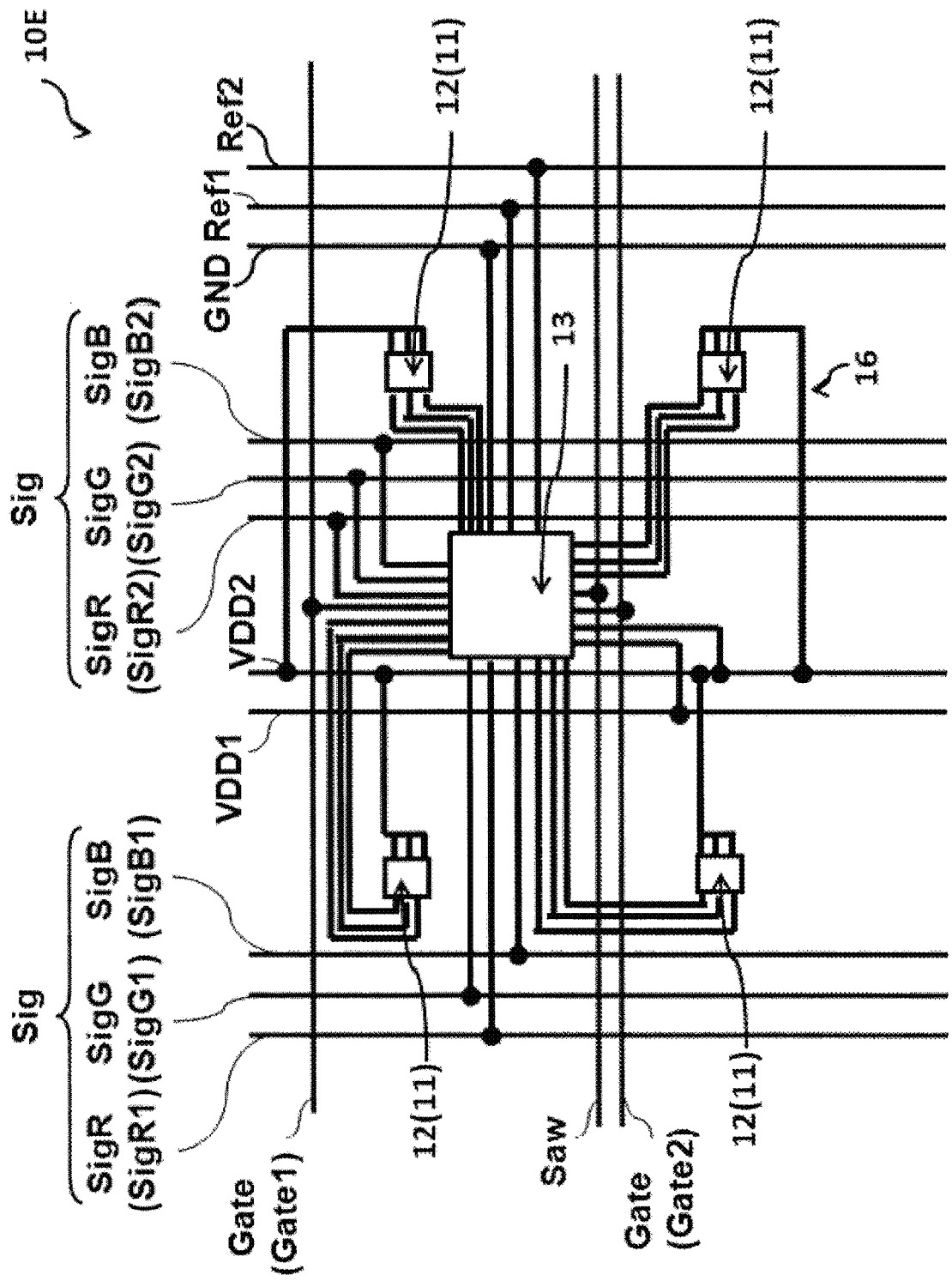

[ FIG. 15 ]
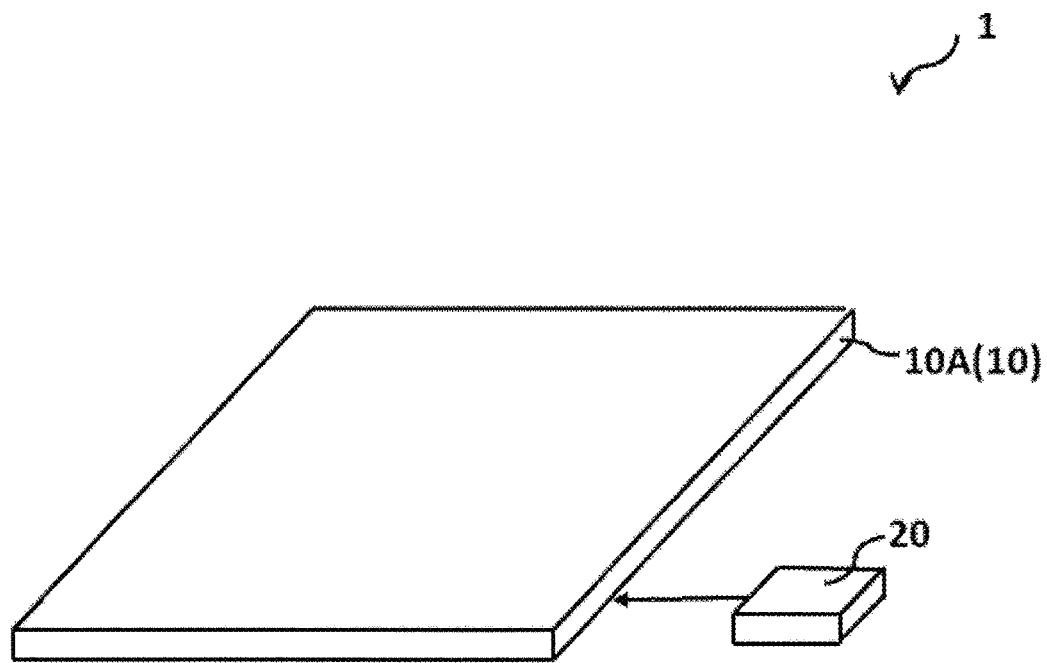
[ FIG. 16 ]
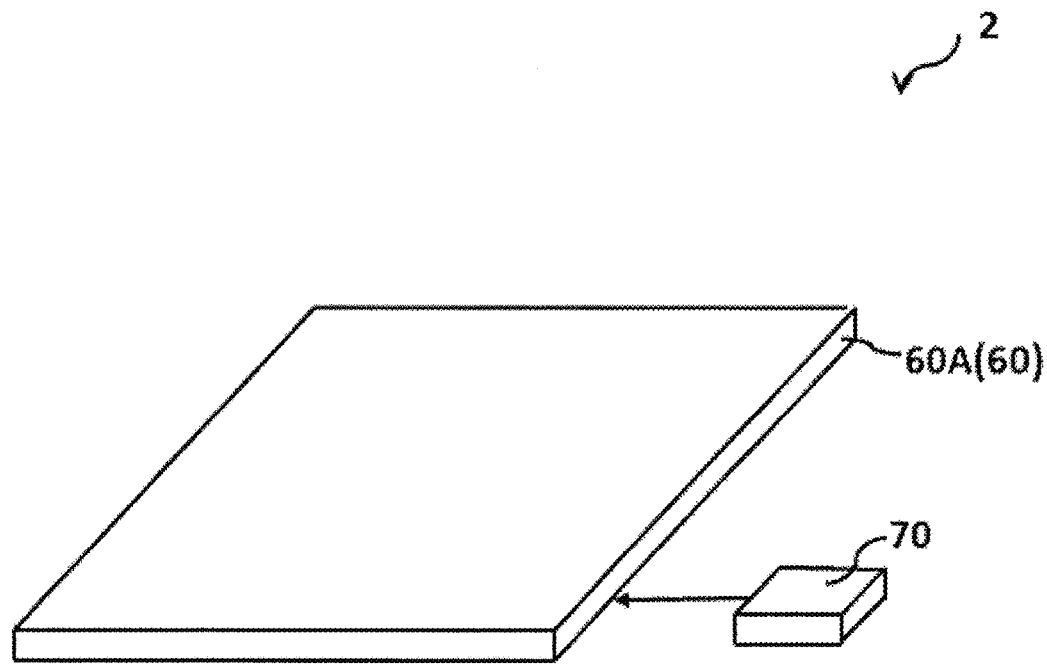

MOUNTING SUBSTRATE AND ELECTRONIC APPARATUS

CROSS-REFERENCE TO RELATED APPLICATIONS

This application is a National Stage of International Application No. PCT/JP2015/057848, filed in the Japanese Patent Office as a Receiving office on Mar. 17, 2015, which claims priority to Japanese Patent Application Number 2014-074843, filed in the Japanese Patent Office on Mar. 31, 2014, each of which is hereby incorporated by reference in its entirety.

TECHNICAL FIELD

The present technology relates to a mounting substrate in which fine pixels are mounted on a wiring substrate, and an electronic apparatus with the mounting substrate.

BACKGROUND ART

Patent Literature 1 discloses a display unit in which each LED (Light Emitting Diode) provided at a point of intersection of a signal line and a scanning line is driven by turning on/off signal lines and scanning lines arranged in a grid. In this driving method, since image display is performed by sequential scanning of the scanning lines, it is not easy to increase display luminance. Therefore, for example, as discussed in Patent Literature 2, it may be conceivable to provide an LED and a drive IC for each pixel and to perform active driving of each LED.

CITATION LIST

Patent Literature

Patent Literature 1: Japanese Unexamined Patent Application Publication No. 2009-037164
Patent Literature 2: Japanese Unexamined Patent Application Publication No. 2003-115613

SUMMARY

In the method discussed in Patent Literature 2, it is necessary to provide many wiring lines to be coupled to the drive IC on a surface (a mounting surface) of a wiring substrate. Therefore, it is desirable to make the LED and the drive IC fine. However, when the LED and the drive IC are made fine, it is difficult to inspect each of them as a single unit due to smallness thereof. Accordingly, it is conceivable to perform an inspection thereof by driving each of the LED and the drive IC in a state of being mounted on the surface of the wiring substrate. However, when a defective item is found, it is not easy to repair the defective item, which is an issue.

In addition, for the purpose of protecting the LED and the drive IC, the LED and the drive IC may be embedded in a resin. When the resin for embedding of the LED and the drive IC is thick, the wiring substrate is easily warped due to the thick resin. When the wiring substrate is warped due to the resin, a defect such as peeling off of the LED and the drive IC from the wiring substrate may occur due to warpage of the wiring substrate. However, when such a defect occurs, an item having the defect is covered with the resin, and therefore it is not easy to repair such a defective item, which is an issue.

It is to be noted that such an issue may occur not only in the field of display unit, but also in the field of illumination unit.

It is therefore desirable to provide a mounting substrate that allows for an easy repair of a pixel after being mounted, and makes it possible to reduce defects when the pixel is covered with a resin, and an electronic apparatus with such a mounting substrate.

A mounting substrate according to an embodiment of the present technology includes: a wiring substrate; a plurality of light-emitting elements arranged in a matrix on the wiring substrate; and a plurality of drive ICs that are arranged in a matrix on the wiring substrate, and control light emission of the light-emitting elements. The light-emitting elements and the drive ICs are mounted on a same surface. The wiring substrate includes a plurality of first wiring lines on the surface where the light-emitting elements and the drive ICs are mounted, and the first wiring lines electrically couple the light-emitting elements to the drive ICs.

An electronic apparatus according to an embodiment of the present technology includes: one or a plurality of mounting substrates mentioned above; and a control circuit that control the one or plurality of mounting substrates.

In the mounting substrate and the electronic apparatus according to the embodiments of the present technology, the light-emitting elements and the drive ICs are mounted on the same surface, and further, the plurality of first wiring lines that electrically couple the light-emitting elements to the drive IC are formed on the surface where the light-emitting elements and the drive ICs are mounted. Since the light-emitting elements and the drive ICs are mounted on a common surface in such a manner, even if a defect is found in the light-emitting element, the drive IC, or the first wiring line in a process of manufacturing the mounting substrate, it is possible to easily repair the light-emitting element, the drive IC, and the first wiring line. In addition, since the light-emitting elements, the drive ICs, and the first wiring lines are formed on common surface, it is possible to reduce a thickness of a resin for embedding of the light-emitting elements, the drive ICs, and the first wiring lines, as compared with a case in which the light-emitting elements and the drive ICs are formed in separate layers, or a case in which the first wiring lines are formed in a layer higher than the surface where the light-emitting elements or the drive IC are mounted.

According to the mounting substrate and the electronic apparatus of the embodiments of the present technology, since the light-emitting elements, the drive ICs, and the first wiring lines are formed on the common surface, it is possible to easily repair the light-emitting element, the drive IC, and the first wiring line after being mounted. Moreover, it is possible to reduce defects that occur when the light-emitting element, the drive IC, and the first wiring line are covered with the resin.

BRIEF DESCRIPTION OF DRAWINGS

FIG. 1 is a diagram illustrating an example of a perspective configuration of a display unit according to a first embodiment of the present technology.

FIG. 2 is a diagram illustrating an example of a perspective configuration of a mounting substrate in FIG. 1.

FIG. 3 is a diagram illustrating an example of a perspective configuration of a unit substrate in FIG. 2.

FIG. 4 is a diagram illustrating an example of a circuit configuration of a cell in FIG. 3.

FIG. 5 is a diagram illustrating an example of a planar configuration of a light-emitting element in FIG. 4.

FIG. 6 is a diagram illustrating an example of a planar configuration of a drive IC in FIG. 4.

FIG. 7 is a diagram illustrating an example of a cross-sectional configuration of the cell in FIG. 3.

FIG. 8 is a diagram illustrating an example of a method of manufacturing the cell in FIG. 7.

FIG. 9 is a diagram illustrating an example of a process following a process in FIG. 8.

FIG. 10 is a diagram illustrating an example of a process following the process in FIG. 9.

FIG. 11 is a diagram illustrating an example of a process following the process in FIG. 10.

FIG. 12 is a diagram illustrating an example of a process following the process in FIG. 11.

FIG. 13 is a diagram illustrating an example of a perspective configuration of an illumination unit according to a second embodiment of the present technology.

FIG. 14 is a diagram illustrating a modification example of the circuit configuration of the cell in FIG. 3.

FIG. 15 is a diagram illustrating a modification example of the perspective configuration of the display unit in FIG. 1.

FIG. 16 is a diagram illustrating a modification example of the perspective configuration of the illumination unit in FIG. 14.

EMBODIMENTS

Embodiments of the present technology will be described below in detail with reference to the drawings. It is to be noted that the description will be provided in the following order.
1. First embodiment (Display Unit)
2. Second embodiment (Illumination Unit)
3. Modification examples 1. First Embodiment

[Configuration]

FIG. 1 illustrates an example of a perspective configuration of a display unit 1 according to a first embodiment of the present technology. The display unit 1 is a so-called LED display, and an LED is used as a display pixel. The display unit 1 may include, for example, a display panel 10, and a control circuit 20 that controls the display panel 10 (specifically, a cell 10E to be described later), as illustrated in FIG. 1.

(Display Panel 10)

The display panel 10 is a panel configured by stacking a mounting substrate 10A and a counter substrate 10B. A surface of the counter substrate 10B serves as an image display surface, and has a display region in its central portion, and a frame region provided therearound as a non-display region. The counter substrate 10B may be disposed, for example, at a position facing the mounting substrate 10A with a predetermined gap in between. It is to be noted that the counter substrate 10B may be in contact with a top surface of the mounting substrate 10A. The counter substrate 10B may have, for example, a light-transmissive that allows visible light to pass therethrough, such as a glass substrate, a transparent resin substrate, and a transparent resin film.

(Mounting Substrate 10A)

FIG. 2 illustrates an example of a perspective configuration of the mounting substrate 10A. For example, the mounting substrate 10A may be configured of a plurality of unit substrates 10C that are tiled as illustrated in FIG. 2. FIG. 3 illustrates an example of a perspective configuration of the unit substrate 10C. The unit substrate 10C may include, for example, a plurality of cells 10E that are tiled, and a supporting substrate 10D that supports each of the cells 10E. The unit substrates 12C each further include a control substrate (not illustrated). The control substrate may be, for example, electrically coupled to each of the cells 10E through each of electrode pads 34 to be described later. The supporting substrate 10D may be configured of, for example, but not limited to, a metal frame or a wiring substrate. In a case in which the supporting substrate 10D is configured of a wiring substrate, it is possible for the supporting substrate 10D to serve also as a control substrate. At this time, one of the supporting substrate 10D and the control substrate, or both are electrically coupled to each of the cells 10E (or a wiring substrate 30 to be described later) through each of the electrode pads 34. The supporting substrate 10D corresponds to a specific example of a "supporting substrate" of the present technology. The electrode pads 34 correspond to a specific example of "electrode pads" of the present technology.

(Circuit Configuration of Cell 10E)

FIG. 4 illustrates an example of a circuit configuration of the cell 10E. The cell 10E includes, in a region facing the above-described display region, a plurality of data lines Sig extending in a column direction, and a plurality of gate lines Gate extending in a row direction. The data lines Sig and the gate lines Gate may be made of, for example, copper. The data lines Sig correspond to a specific example of "signal lines" of the present technology. The gate lines Gate correspond to a specific example of "selection line" of the present technology. The cell 10E further includes a plurality of pixels 11 arranged in a matrix in the region facing the above-described display region. The pixels 11 each include a light-emitting element 12 and a drive IC 13 that drives the light-emitting element 12. The pixels 11 correspond to a specific example of "pixels" of the present technology. The light-emitting element 12 corresponds to a specific example of a "light-emitting element" of the present technology. The drive IC 13 corresponds to a specific example of a "drive IC" of the present technology.

The cell 10E may further include, for example, a plurality of sawtooth voltage lines Saw, a plurality of power source lines VDD1 and VDD2, a plurality of reference voltage lines Ref1 and Ref2, and a plurality of ground lines GND, in the region facing the above-described display region. The sawtooth voltage lines Saw may each extend, for example, in the row direction. The power source lines VDD1, the power source lines VDD2, the reference voltage lines Ref1, the reference voltage lines Ref2, and the ground lines GND may each extend, for example, in the column direction. It is possible to omit one or more of the sawtooth voltage line Saw, the power source lines VDD1 and VDD2, the reference voltage lines Ref1 and Ref2, and the ground line GND, depending on a driving mode. The sawtooth voltage line Saw, the power source lines VDD1 and VDD2, the reference voltage lines Ref1 and Ref2, and the ground lines GND may be made of, for example, copper. It is to be noted that, in the following, the data lines Sig, the power source lines VDD1, the power source lines VDD2, the reference voltage lines Ref1, the reference voltage lines Ref2, and the ground lines GND are collectively referred to as column wiring lines. Further, in the following, the gate lines Gate and the sawtooth voltage lines Saw are collectively referred to as row wiring lines.

Each of the data lines Sig is a wiring line to which a signal corresponding to an image signal is to be inputted by the control circuit 20. The signal corresponding to the image signal may be, for example, a signal for control of light emission luminance of the light-emitting element 12. The plurality of data lines Sig may be, for example, wiring lines of a number of kinds corresponding to the number of emission colors of the light-emitting element 12. When the light-emitting element 12 has three emission colors, the plurality of data lines Sig may include, for example, a plurality of data lines SigR, a plurality of data lines SigG, and a plurality of data lines SigB. Each of the data lines SigR is a wiring line to which a signal corresponding to a red image signal is to be inputted by the control circuit 20. Each of the data lines SigG is a wiring line to which a signal corresponding to a green image signal is to be inputted by the control circuit 20. Each of the data lines SigB is a wiring line to which a signal corresponding to a blue image signal is to be inputted by the control circuit 20.

The emission colors of the light-emitting element 12 may be four or more colors, without being limited to three colors. When the plurality of data lines Sig include the plurality of data lines SigR, the plurality of data lines SigG, and the plurality of data lines SigB, one set of the data lines Sig configured of one data line SigR, one data line SigG, and one data line SigR may be, for example, assigned to each pixel column. Depending on the driving mode, the above-described one set of the data lines Sig is assigned to every plurality of pixel columns. Further, depending on the driving mode, it is possible to replace the above-described one set of the data lines Sig with the single data line Sig.

Each of the gate lines Gate is a wiring line to which a signal for selection of the light-emitting element 12 is to be inputted by the control circuit 20. The signal for selection of the light-emitting element 12 may be, for example, a signal to start sampling the signal inputted to the data line Sig, and to allow the sampled signal to be inputted to the light-emitting element 12, thereby starting light emission of the light-emitting element 12. One of the gate lines Gate may be assigned, for example, for each pixel row. Each of the sawtooth voltage lines Saw may be, for example, a wiring line to which a signal having a sawtooth waveform is to be inputted by the control circuit 20. The signal having a sawtooth waveform is compared with a sampled signal, and, for example, the sampled signal may be inputted to the light-emitting element 12, for only a period in which a peak value of the signal having a sawtooth waveform is higher than a peak value of the sampled signal. One of the sawtooth voltage lines Saw may be assigned, for example, to every two pixel rows. Each of the power source lines VDD2 is a wiring line to which a drive current to be supplied to the light-emitting element 12 is to be inputted by the control circuit 20. One of the power source lines VDD2 may be assigned, for example, to every two pixel columns. Each of the power source lines VDD1, the reference voltage lines Ref1, the reference voltage lines Ref2, and the ground lines GND is a wiring line to which a fixed voltage is to be inputted by the control circuit 20. A ground potential is inputted to each of the ground lines GND. One of the power source lines VDD1 may be assigned, for example, to every two pixel columns. One of the reference voltage lines Ref1 may be assigned, for example, to every two pixel columns. One of the reference voltage lines Ref2 may be assigned, for example, to every two pixel columns. One of the ground lines GND may be assigned, for example, to every two pixel columns.

FIG. 5 illustrates an example of a planar configuration of the light-emitting element 12. A symbol in a square in FIG. 5 indicates that a terminal adjacent to this symbol is electrically coupled to a terminal adjacent to a symbol identical thereto in FIG. 6 to be described later. The light-emitting element 12 is a chip-like component that emits light of a plurality of colors. When the emission colors of the light-emitting element 12 are three colors, the light-emitting element 12 may include, for example, the light-emitting element 12R that emits red light, the light-emitting element 12G that emits green light, and the light-emitting element 12B that emits blue light. The light-emitting elements 12R, 12G, and 12B may be covered with, for example, a protector 12i made of resin or any other material.

Each of the light-emitting elements 12R, 12G, and 12B may be, for example, an LED chip. Herein, the above-described LED chip has a micrometer-order chip size, and may have several tens of μm square, for example. The LED chip may include, for example, a semiconductor layer and two electrodes disposed on a common surface (same surface) where the semiconductor layer is disposed. The semiconductor layer may have a stacked configuration in which an active layer is interposed between semiconductor layers of different conductive types. The light-emitting elements 12R, 12G, and 12B may be chips separate from each other, or may form a common single chip.

The light-emitting element 12 may include, for example, six electrode pads 12a to 12f. In the light-emitting element 12G, one electrode is electrically coupled to an electrode pad 13m of the drive IC 13 through the electrode pad 12a and a wiring line 16 (see FIG. 4), and the other electrode is electrically coupled to the ground line GND through the electrode pad 12b and the wiring line 16. In the light-emitting element 12R, one electrode is electrically coupled to an electrode pad 13o of the drive IC 13 through the electrode pad 12c and the wiring line 16, and the other electrode is electrically coupled to the ground line GND through the electrode pad 12d and the wiring line 16. In the light-emitting element 12B, one electrode is electrically coupled to an electrode pad 13p of the drive IC 13 through the electrode pad 12e and the wiring line 16, and the other electrode is electrically coupled to the ground line GND through the electrode pad 12f and the wiring line 16.

The wiring line 16 may be, for example, a wiring line that electrically couples the pixel 11 to one of the data line Sig, the gate line Gate, the power source line VDD1, the power source line VDD2, the reference voltage line Ref1, the reference voltage line Ref2, the sawtooth voltage line Saw, or the ground line GND. The wiring line 16 may also be, for example, a wiring line that electrically couples the drive IC 13 and the light-emitting element 12 to each other, in the pixel 11. The wiring line 16 may be formed by, for example, sputtering or plating. The wiring lines 16 correspond to specific examples of a "first wiring line", a "third wiring line", and a "third wiring line" of the present technology.

The wiring lines 16 are formed in the same layer (or in the same plane). Some of a plurality of wiring lines 16 directly couple the pixel 11 to any of the above-described various row wiring lines or the above-described various column wiring lines. Each of the other wiring lines 16 of the plurality of wiring lines 16 is made up of a plurality of partial wiring lines that are discretely formed. In each of the wiring lines 16 made up of the plurality of partial wiring lines, partial electrodes may be coupled through one or a plurality of wiring lines (for example, one or a plurality of relay wiring lines 15) that are formed in a layer (for example, a wiring layer 32E to be described later) lower than each of the wiring lines 16. The relay wiring line 15 may be made of, for example, copper.

FIG. 6 illustrates an example of a planar configuration of the drive IC 13. A wiring line name in a square in FIG. 6 represents the name of a wiring line electrically coupled to a terminal adjacent to this wiring line name. The drive IC 13 controls the light emission of the light-emitting element 12. The drive IC 13 may include, for example, fourteen electrode pads 13a, 13b, 13c, 13d, 13e, 13f, 13g, 13h, 13i, 13k, 13m, 13n, 13o, and 13p.

The electrode pads 13a, 13b, and 13c are electrically coupled to the data lines SigG, SigR, and SigB through the wiring lines 16. The electrode pads 13d and 13e are electrically coupled to the power source lines VDD1 and VDD2 through the wiring lines 16. The electrode pads 13f and 13g are electrically coupled to the reference potential lines Ref1 and Ref2 through the wiring lines 16. The electrode pad 13h is electrically coupled to the ground line GND through the wiring line 16. The electrode pad 13i is electrically coupled to the gate line Gate through the wiring line 16. The electrode pad 13k is electrically coupled to the sawtooth voltage line Saw through the wiring line 16. The electrode pads 13m, 13o, and 13n are electrically coupled to the electrode pads 12a, 12c, and 12e of the light-emitting element 12, through the wiring lines 16. The electrode pad 13p is not coupled to the wiring line 16.

(Configuration of Cell 10E)

FIG. 7 illustrates an example of a cross-sectional configuration of the cell 10E. FIG. 7 illustrates an example of a cross-sectional configuration of a portion of the cell 10E. In the portion, the light-emitting element 12, the drive IC 13, a data line SigB1, and a gate line Gate2 are formed. The cell 10E includes the wiring substrate 30, a fine L/S layer 40 formed in contact with a top surface of the wiring substrate 30, and the plurality of pixels 11 arranged in a matrix on a top surface of the fine L/S layer 40. The wiring substrate 30 has a role as an intermediate substrate in relation to a wiring substrate 10D. The wiring substrate 30 corresponds to a specific example of a "wiring substrate" of the present technology. The fine L/S layer 40 corresponds to a specific example of a "fine L/S layer" of the present technology.

The cell 10E may further include, for example, an embedding layer 44, a light-shielding layer 45, and an insulating layer 50. A surface including the pixels 11 is covered with the embedding layer 44. The light-shielding layer 45 is formed in contact with the embedding layer 44. The insulating layer 50 is formed in contact with a rear surface of the wiring substrate 30. The embedding layer 44 is made of a light-transmissive material that allows visible light to pass therethrough, and may be, for example, configured of a light-transmissive resin layer that allow visible light to pass therethrough. The light-shielding layer 45 includes a visible-light absorbing material. The insulating layer 50 may be made of, for example, an ultraviolet curable resin or a thermosetting resin.

The light-shielding layer 45 has an opening 45A at a position facing each of the light-emitting elements 12. Light emitted from each of the light-emitting elements 12 is outputted to outside through each of the openings 45A. The insulating layer 50 has an opening 50A at a position facing each of the electrode pads 34 serving as an external connection terminal of the cell 10E. Accordingly, each of the electrode pads 34 is exposed on a rear surface of the cell 10E (the wiring substrate 30) through the opening 50A. The electrode pad 34 and the wiring substrate 10D may be electrically coupled to each other, through, for example, a metal bump or solder bump provided in the opening 50A.

(Wiring Substrate 30)

The wiring substrate 30 may be, for example, a multilayer substrate in which interlayer electrical coupling is made by a via. The wiring substrate 30 includes, on the rear surface of the wiring substrate 30, the plurality of electrode pads 34 each serving as the external connection terminal. For example, one or more of the plurality of electrode pads 34 may be provided for each of a data line SigR1, a data line SigG1, the data line SigB1, a gate line Gate1, the gate line Gate2, the power source line VDD1, the reference voltage line Ref1, the reference voltage line Ref2, and the sawtooth voltage line Saw.

The wiring substrate 30 electrically couples the plurality of wiring lines 16 routed in the fine L/S layer 40 to the plurality of electrode pads 34. The wiring substrate 30 includes a plurality of through wiring lines 17 that electrically couple the plurality of wiring lines 16 to the plurality of electrode pads 34. Each of the through wiring lines 17 is a wiring line penetrating the wiring substrate 30 in a thickness direction. Some of the through wiring lines 17 each include the data line Sig extending in the column direction in a given layer, and a plurality of vias 14 penetrating one or more of layers in the wiring substrate 30. Some of the through wiring lines 17 each include the gate line Gate extending in the row direction in a given layer, and a plurality of vias 14 penetrating one or more of the layers in the wiring substrate 30.

Some of the through wiring lines 17 each include the power source line VDD1 extending in the column direction in a given layer, and a plurality of vias 14 penetrating one or more of the layers in the wiring substrate 30. Some of the through wiring lines 17 each include the reference voltage line Ref1 extending in the column direction in a given layer, and a plurality of vias 14 penetrating one or more of the layers in the wiring substrate 30. Some of the through wiring lines 17 each include the reference voltage line Ref2 extending in the column direction in a given layer, and a plurality of vias 14 penetrating one or more of the layers in the wiring substrate 30. Some of the through wiring lines 17 each include the sawtooth voltage line Saw extending in the column direction in a given layer, and a plurality of vias 14 penetrating one or more of the layers in the wiring substrate 30.

Incidentally, as described above, the plurality of pixels 11 are arranged at equal intervals along the row direction and the column direction as illustrated in FIG. 4. At this time, a pitch of the pixels 11 may be preferably equal not only in each of the cells 10E but also in two adjacent cells 10E. In each of the cells 10E, a plurality of electrode pads 34 are provided as the external connection terminals of each of the cells 10E on the rear surface of the cell 10E. This makes it possible to omit or minimize a frame region that is not usable for arrangement of the pixels 11, for example, in a case in which an external connection terminal is provided on an outer edge of a top surface of a mounting surface. Accordingly, in a case in which such a frame region is omitted from each of the cells 10E, or such a frame region is minimized in each of the cells 10E, it is possible for the pitch of the pixels 11 to be equal even in two adjacent cells 10E.

The wiring substrate 30 may be, for example, a build-up substrate including a core substrate 31, a build-up layer 32, and a build-up layer 33. The build-up layer 32 is formed in contact with a top surface of the core substrate 31. The build-up layer 33 is formed in contact with a rear surface of the core substrate 31. The wiring substrate 30 corresponds to a specific example of a "build-up substrate" of the present technology. The build-up layers 32 and 33 each correspond to a specific example of a "build-up layer" of the present technology.

The core substrate 31 ensures rigidity of the cell 10E, and may be, for example, a glass epoxy substrate. The build-up layer 32 includes one or more wiring layers. The build-up layer 32 may include, for example, a wiring layer 32A, an insulating layer 32B, a wiring layer 32C, an insulating layer 32D, and the wiring layer 32E in this order from the top surface of the core substrate 31, as illustrated in FIG. 7. The build-up layer 33 includes one or more wiring layers. The build-up layer 33 may include, for example, a wiring layer 33A, an insulating layer 33B, a wiring layer 33C, an insulating layer 33D, and a wiring layer 33E in this order from the rear surface of the core substrate 31, as illustrated in FIG. 7. The wiring layers 32A, 32C, 32E, 33A, 33C, and 33E may be made of, for example, copper. The insulating layers 32B, 32D, 33B, and 33D may be made of, for example, an ultraviolet curable resin or a thermosetting resin.

Each of the data lines Sig may be formed, for example, in the wiring layer 32C. FIG. 7 illustrates, by way of example, a state where the data line SigB1 is formed in the wiring layer 32C. Each of the gate lines Gate is formed in a layer different from that of the data line Sig, and may be formed, for example, in a layer being in the build-up layer 32 and different from that of the data line Sig. FIG. 7 illustrates, by way of example, a state where the gate line Gate2 is formed in the wiring layer 32A. Each of the power source lines VDD2 and the ground lines GND may be formed, for example, in the wiring layer 32E. Each of the electrode pads 34 is formed in the build-up layer 33, and may be formed, for example, in the same layer as the wiring layer 33E. The relay wiring line 15 to be described later is formed in the wiring layer 32E, which is a wiring layer forming the top surface of the wiring substrate 30.

(Fine L/S Layer 40)

The fine L/S layer 40 includes a wiring layer 42, and an insulating layer 41 provided between the wiring layer 42 and the top surface of the wiring substrate 30. The insulating layer 41 is in contact with the wiring layer 42 and the top surface of the wiring substrate 30. The wiring layer 42 is a layer including each of the wiring lines 16. Therefore, the wiring layer 42 is formed in the fine L/S layer 40. Further, the insulating layer 41 is provided between each of the wiring lines 16 and the top surface of the wiring substrate 30, and is in contact with each of the wiring lines 16 and the top surface of the wiring substrate 30. The insulating layer 41 may have an opening 41A, for example, at a position facing each of the gate line Gate and the data line Sig. The insulating layer 41 may further have the opening 41A at a position facing the relay wiring line 15 electrically coupled to the above-described partial electrode. A portion of each of the gate line Gate, the data line Sig, and the relay wiring line 15 is exposed on a bottom surface of the opening 41A. The insulating layer 41 may be formed of, for example, VPA. VPA is generally used as a resist. For example, VPA manufactured from Nippon Steel Chemical Co., Ltd. has been introduced on the market. In a case in which the insulating layer 41 is made of VPA, for example, selective light-exposure and development of VPA may make it possible to form the opening 41 in VPA.

The wiring layer 42 (each of the wiring lines 16) may include, for example, a seed layer 42A and a plating layer 42B. The seed layer 42A is in contact with the top surface of the wiring substrate 30 including the bottom surfaces and side surfaces of the openings 41A. The plating layer 42B is in contact with a top surface of the seed layer 42A. The seed layer 42A serves as a plating growth surface when the plating layer 42B is formed in a manufacturing process. The seed layer 42A is in contact with the bottom surface of the opening 41A, and may be, for example, electrically coupled to the gate line Gate, the data line Sig, and the relay wiring line 15. The seed layer 42A may be made of, for example, copper. The plating layer 42B is formed by a plating process using the seed layer 42A as the plating growth surface in the manufacturing process. It is to be noted that, for example, the wiring layer 42 (each of the wiring lines 16) may be a layer formed by sputtering.

As described above, the wiring layer 42 (each of the wiring lines 16) is formed in contact with a top surface of the insulating layer 41. In contrast, electrodes of the pixels 11 are formed in contact with the top surface of the seed layer 42A. Therefore, the light-emitting element 12 and the drive IC 13 are formed on the same surface (the top surface of the seed layer 42A). To be exact, the light-emitting elements 12 and the drive ICs 13 are formed on a surface different from a surface (the top surface of the insulating layer 41) where the wiring layer 42 (each of the wiring lines 16) is formed. However, in terms of mounting of the pixels 11, a surface including the top surface of the insulating layer 41 and the top surface of the seed layer 42A serves as a mounting surface 41S. Accordingly, the wiring layer 42 (each of the wiring lines 16) is formed on the mounting surface 41S for the pixels 11, and is formed on a surface substantially common to the pixels 11.

The wiring layer 42 (each of the wiring lines 16) may be bonded by plating to, for example, to the gate line Gate, the data line Sig, and the relay wiring line 15 electrically coupled to the above-described partial electrode. When the wiring layer 42 (each of the wiring lines 16) is formed by plating, bonding between the wiring layer 42 (each of the wiring lines 16) and the gate line Gate and the data line Sig may be performed together in a process of forming the wiring layer 42 (each of the wiring lines 16). The wiring layer 42 (each of the wiring lines 16) may be bonded to, for example, the pixels 11 (the light-emitting elements 12 and the drive ICs 13) by plating. When the wiring layer 42 (each of the wiring lines 16) is formed by plating, bonding between the wiring layer 42 (each of the wiring lines 16) and the pixels 11 may be performed together in the process of forming the wiring layer 42 (each of the wiring lines 16).

An L/S (line and space) of the fine L/S layer 40 is smaller than an L/S of the wiring substrate 30. The L/S indicates the narrowest wiring pitch in a plane. The L/S of the fine L/S layer 40 is smaller than those of the plurality of signal lines Sig, the plurality of gate lines Gate, the plurality of voltage lines VDD1, the plurality of reference voltage lines Ref1, the plurality of reference voltage lines Ref2, and the sawtooth voltage line Saw. The L/S of the fine L/S layer 40 may be, for example, about 25 µm. In contrast, the L/S of the wiring substrate 30 may be, for example, about 75 µm.

[Manufacturing Method]

Next, an example of a method of manufacturing the mounting substrate 10A will be described with reference to FIG. 8 to FIG. 12. FIG. 8 to FIG. 12 illustrate an example of a procedure of manufacturing the mounting substrate 10A in order of processes.

First, the wiring substrate 30 is prepared. Next, the insulating layer 41 is formed on the top surface of the wiring substrate 30, and then the opening 41A is formed in the insulating layer 41, at the positon facing the top surface of each of the gate line Gate and the data line Sig, by a predetermined method (FIG. 8). At this time, although not illustrated, the opening 41A is also formed, by a predetermined method, at the position facing the top surface of the relay wiring line 15 electrically coupled to the above-described partial wiring line. Next, the seed layer 42A is formed on the top surface of the wiring substrate 30 including the bottom surface and the side surface of the opening 41A (FIG. 9).

Next, a fixing layer 43A that temporarily fixes the light-emitting element 12 and the drive IC 13 is formed by a process such as coating an entire surface with an insulating glue (see FIG. 10). A layer of an adhesive as typified by a silicone-based adhesive and an acrylic-based adhesive may be formed as the fixing layer 43A instead of the glue. Subsequently, the light-emitting element 12 and the drive IC 13 are temporarily fixed by the fixing layer 43A (FIG. 10). At this time, the electrode pads 12a to 12e of the light-emitting element 12 and the electrode pads 13a to 13p of the drive IC 13 are disposed close enough to be connectable to a metal body (the plating layer 42B) that is to be grown in a plating process to be described later.

Next, the fixing layer 43A except for portions temporarily fixing the light-emitting elements 12 and the drive ICs 13 (portions present on the bottom surfaces of the light-emitting elements 12 and the drive ICs 13, of the fixing layer 43A) is removed. As a result, the fixing layer 43A remains only on the bottom surfaces of the light-emitting elements 12 and the drive ICs 13 (FIG. 11). In FIG. 11, the remaining fixing layer 43A is illustrated as a fixing layer 43. In removing the fixing layer 43A, it may be possible to perform, for example, dry etching or organic solvent immersion. It is to be noted that the insulating glue may be applied beforehand only to positions where the light-emitting elements 12 and the drive ICs 13 are to be temporarily fixed.

Thereafter, the plating process is performed with use of the seed layer 42A as the plating growth surface to form the plating layer 42B on the top surface of the seed layer 42A (FIG. 12). Thus, the wiring layer 42 (each of the wiring lines 16) is formed. At this time, bonding between the wiring layer 42 (each of the wiring lines 16), and the gate line Gate and the data line Sig is performed together in the process of forming the wiring layer 42 (each of the wiring lines 16). In addition, bonding between the wiring layer 42 (each of the wiring lines 16) and the pixels 11 is performed together in the process of forming the wiring layer 42 (each of the wiring lines 16). Afterwards, the light-emitting elements 12 and the drive ICs 13 are embedded in the embedding layer 43, and thereafter, the light-shielding layer 45 is formed (see FIG. 7). Thus, the mounting substrate 10A is manufactured.

[Workings and Effects]

Next, workings and effects of the display unit 1 will be described. In the present embodiment, the light-emitting element 12, and the drive IC 13 are formed on the same surface, and further, in each of the pixels 11, a plurality of wiring lines 16 that electrically couple the light-emitting element 12 to the drive IC 13 are also formed on the mounting surface 41S. In this way, the light-emitting element 12, the drive IC 13, and the wiring line 16 are formed on the common mounting surface 41S. Therefore, in a process of manufacturing the mounting substrate 10A, even if a defect is found in the light-emitting element 12, the drive IC 13, or the wiring lines 16, for example, in a stage illustrated in FIG. 12, it may be possible to easily repair the light-emitting element 12, the drive IC 13, and the wiring lines 16. In addition, since the light-emitting element 12, the drive IC 13, and the wiring lines 16 are formed on the common mounting surface 41S, it is possible to reduce a thickness of the resin (the embedding layer 44) for embedding of the light-emitting element 12, the drive IC 13, and the wiring lines 16, as compared with a case in which the light-emitting element 12 and the drive IC 13 are formed in separate layers, or a case in which the wiring lines 16 are formed in a layer higher than the mounting surface 41S for the light-emitting element 12 or the drive IC 13. Therefore, it is possible to easily repair the pixel 11 after being mounted, and it is also possible to reduce defects that occur when the pixels 11 is covered with the resin.

2. Second Embodiment

FIG. 13 illustrates an example of a perspective configuration of an illumination unit 2 according to a second embodiment of the present technology. The illumination unit 2 corresponds to the display unit 1 according to any of the above-described first embodiment and some modification examples thereof, except that a signal to be inputted to the data line Sig does not change momently like the image signal, but has a fixed value corresponding to brightness of illumination light. The illumination unit 2 may include, for example, an illumination panel 60 and a control circuit 70 that controls the illumination panel 60, as illustrated in FIG. 13.

The illumination panel 60 is a panel configured by stacking a mounting substrate 60A and a counter substrate 60B. A surface of the counter substrate 60B serves as a light emission surface. The counter substrate 60B is disposed at a position facing the mounting substrate 60A with a predetermined gap in between. It is to be noted that the counter substrate 60B may be in contact with a top surface of the mounting substrate 60A. The counter substrate 60B may have, for example, a light-transmissive substrate that allows visible light to pass therethrough, such as a glass substrate, a transparent resin substrate, and a transparent resin film.

The mounting substrate 60A may be configured of, for example, a plurality of unit substrates that are tiled as illustrated in FIG. 2. Each of the unit substrates may include, for example, a plurality of cells that are tiled and a wiring substrate that supports each of the cells. Each of the unit substrates further includes a control substrate (not illustrated), and is electrically coupled to each of the cells through each of electrode pads 34. The above-described supporting substrate may be configured of, for example, but not limited to, a metal frame or a wiring substrate. In a case in which the supporting substrate is configured of a wiring substrate, it is possible for the supporting substrate to also serve as a control substrate. In each of the cells, wiring lines that are unnecessary for driving of the pixels 11 in a case in which a signal to be inputted to the data line Sig has a fixed value corresponding to the brightness of the illumination light may be omitted as appropriate in FIG. 4 and FIG. 7, for example.

[Workings and Effects]

Next, workings and effects of the illumination unit 2 will be described. In the present embodiment, as with the display unit 1 according to the above-described first embodiment and some modification examples thereof, the light-emitting element 12, the drive IC 13, and the wiring lines 16 are formed on the common mounting surface 41S. Therefore, in a process of manufacturing the mounting substrate 1, even if a defect is found in the light-emitting element 12 or the drive IC 13, it is possible to easily repair the light-emitting element 12 and the drive IC 13. In addition, it is possible to reduce the thickness of the resin (the embedding layer 44)

for embedding of the light-emitting element 12, the drive IC 13, and the wiring lines 16, as compared with a case in which the light-emitting element 12 and the drive IC 13 are formed in separate layers, or a case in which the wiring lines 16 are formed in a layer higher than the mounting surface 41S of the light-emitting element 12 or the drive IC 13. Therefore, it is possible to easily repair the pixel 11 after being mounted, and it is also possible to reduce defects that occur when the pixel 11 is covered with the resin.

3. Modification Examples

In the above-described embodiments, the light-shielding layer 45 may be disposed at the rear surface (the surface on side of each of the mounting substrates 10A and 60A) of each of the counter substrates 10B and 60B.

In the above-described embodiments and modification examples thereof, one of the drive ICs 13 is provided for each of the light-emitting elements 12. Alternatively, one of the drive ICs 13 may be provided for every plurality of light-emitting elements 12. For example, one of the drive ICs 13 may be provided for every four of the light-emitting elements 12 in a 2-by-2 array, as illustrated in FIG. 14.

In the above-described embodiments and modification examples thereof, for example, the counter substrates 10B and 60B may be omitted as illustrated in FIG. 15 and FIG. 16. Further, in the above-described embodiments and modification examples thereof, one counter substrate 10B or one counter substrate 60B may be provided for each of the unit substrates 10C or each of the cells 10E.

In the above-described embodiments and modification examples thereof, the light-emitting element 12 may have a single emission color. In this case, the cell 10E may include, for example, a color filter for a plurality of colors in the opening 45A.

In the above-described embodiments and modification examples thereof, the light-shielding layer 45 may be omitted.

Further, in the above-described embodiments and modification examples thereof, the pixels 11 (the light-emitting elements 12 and the drive ICs 13) are bonded to the wiring layer 42 (each of the wiring lines 16) by plating. Alternatively, for example, the pixels 11 may be bonded to the wiring layer 42 by soldering. For example, solder bumps may be provided on the electrode pads of the light-emitting elements 12 and the drive ICs 13, and thereafter, the light-emitting elements 12 and the drive ICs 13 may be disposed on the wiring lines 16. Thereafter, a reflow may be performed. This makes it possible to bond the light-emitting elements 12 and the drive ICs 13 to the wiring lines 16 by soldering.

Moreover, the present technology may have any of the following configurations.

(1) A mounting substrate, including:
a wiring substrate; and
a plurality of pixels arranged in a matrix on the wiring substrate,
wherein each of the pixels includes a light-emitting element and a drive IC that controls light emission of the light-emitting element,
wherein the light-emitting element and the drive IC are mounted on a same surface, and
the wiring substrate includes a plurality of first wiring lines on the surface where the light-emitting element and the drive IC are mounted, the first wiring lines that electrically couple the light-emitting element to the drive IC in each of the pixels.

(2) The mounting substrate according to (1), wherein
the wiring substrate includes
a plurality of selection lines formed in a layer lower than the first wiring lines, and extending in a row direction,
a plurality of signal lines formed in a layer lower than the first wiring lines, and extending in a column direction,
one or a plurality second wiring lines formed in the same layer as the first wiring lines or in a layer lower than the first wiring lines, and electrically coupled to each of the selection lines, and
one or a plurality of third wiring lines formed in the same layer as the first wiring lines or in a layer lower than the first wiring lines, and electrically coupled to each of the signal lines, and
the drive ICs are electrically coupled to the one or plurality of the second wiring lines and the one or plurality of the third wiring lines.

(3) The mounting substrate according to (2), wherein
the wiring substrate includes
a build-up substrate that includes a core substrate and one or more build-up layers formed on each of both sides of the core substrate, and in which interlayer electrical coupling is made by a via, and
a fine L/S (line and space) layer formed in contact with a top surface of the build-up substrate,
an L/S of the fine L/S layer is smaller than an L/S of the build-up substrate,
the selection lines and the signal lines are formed in the build-up layer, and
the first wiring lines, the second wiring lines, and the third wiring lines are formed in the fine L/S layer.

(4) The mounting substrate according to (3), wherein the wiring substrate includes a resin layer that covers a surface including the light-emitting elements and the drive ICs.

(5) An electronic apparatus provided with one or a plurality of mounting substrates and a control circuit that controls the one or plurality of mounting substrates, the mounting substrate including:
a wiring substrate; and
a plurality of pixels arranged in a matrix on the wiring substrate,
wherein each of the pixels includes a light-emitting element and a drive IC that controls light emission of the light-emitting element,
wherein the light-emitting element and the drive IC are mounted on a same surface, and
the wiring substrate includes a plurality of first wiring lines on the surface where the light-emitting element and the drive IC are mounted, the first wiring lines that electrically couple the light-emitting element to the drive IC in each of the pixels.

The present application is based on and claims priority from Japanese Patent Application No. 2014-074843 filed in the Japan Patent Office on Mar. 31, 2014, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

The invention claimed is:
1. A mounting substrate, comprising:
a wiring substrate;
a plurality of light-emitting elements arranged in a matrix on a surface of the wiring substrate; and a plurality of drive ICs that are arranged in a matrix on the surface of the wiring substrate, and control light emission of the light-emitting elements, wherein the light-emitting elements are mounted in direct contact with a top surface of a seed layer formed on the wiring substrate and the drive ICs are mounted in direct contact with the top surface of the seed layer formed on the wiring substrate, and the wiring substrate includes a plurality of first wiring lines on the surface where the light-emitting elements and the drive ICs are mounted, the first wiring lines electrically coupling the light-emitting elements to the drive ICs, wherein the wiring substrate includes a plurality of selection lines formed in a layer lower than the first wiring lines, and extending in a row direction, a plurality of signal lines formed in a layer lower than the first wiring lines, and extending in a column direction, one or a plurality of second wiring lines formed in the same layer as the first wiring lines or in a layer lower than the first wiring lines, and electrically coupled to each of the selection lines, and one or a plurality of third wiring lines formed in the same layer as the first wiring lines or in a layer lower than the first wiring lines, and electrically coupled to each of the signal lines, and the drive ICs are electrically coupled to the one or plurality of the second wiring lines and the one or plurality of the third wiring lines and wherein the wiring substrate includes a build-up substrate that includes a core substrate and one or more build-up layers formed on each of both sides of the core substrate, and in which interlayer electrical coupling is made by a via, and a fine L/S (line and space) layer formed in contact with a top surface of the build-up substrate, wherein an L/S of the fine L/S layer is smaller than an L/S of the build-up substrate, the selection lines and the signal lines are formed in the build-up layer, and the first wiring lines, the second wiring lines, and the third wiring lines are formed in the fine L/S layer.

2. The mounting substrate according to claim 1, wherein the wiring substrate includes a resin layer that covers a surface including the light-emitting elements and the drive ICs.

3. An electronic apparatus provided with one or a plurality of mounting substrates and a control circuit that controls the one or plurality of mounting substrates, the mounting substrate comprising:

a wiring substrate;

a plurality of light-emitting elements arranged in a matrix on a surface of the wiring substrate; and a plurality of drive ICs that are arranged in a matrix on the surface of the wiring substrate, and control light emission of the light-emitting elements, wherein the light-emitting elements are mounted in direct contact with a top surface of a seed layer formed on the wiring substrate and the drive ICs are mounted in direct contact with the top surface of the seed layer formed on the wiring substrate, and the wiring substrate includes a plurality of first wiring lines on the surface where the light-emitting elements and the drive ICs are mounted, the first wiring lines electrically coupling the light-emitting elements to the drive ICs, wherein the wiring substrate includes a plurality of selection lines formed in a layer lower than the first wiring lines, and extending in a row direction, a plurality of signal lines formed in a layer lower than the first wiring lines, and extending in a column direction, one or a plurality of second wiring lines formed in the same layer as the first wiring lines or in a layer lower than the first wiring lines, and electrically coupled to each of the selection lines, and one or a plurality of third wiring lines formed in the same layer as the first wiring lines or in a layer lower than the first wiring lines, and electrically coupled to each of the signal lines, and the drive ICs are electrically coupled to the one or plurality of the second wiring lines and the one or plurality of the third wiring lines and wherein the wiring substrate includes a build-up substrate that includes a core substrate and one or more build-up layers formed on each of both sides of the core substrate, and in which interlayer electrical coupling is made by a via, and a fine L/S (line and space) layer formed in contact with a top surface of the build-up substrate, wherein an L/S of the fine L/S layer is smaller than an L/S of the build-up substrate, the selection lines and the signal lines are formed in the build-up layer, and the first wiring lines, the second wiring lines, and the third wiring lines are formed in the fine L/S layer.

* * * * *